United States Patent

Gillingham

[11] Patent Number: 6,088,774
[45] Date of Patent: Jul. 11, 2000

[54] READ/WRITE TIMING FOR MAXIMUM UTILIZATION OF BIDIRECTIONAL READ/WRITE BUS

[75] Inventor: Peter Bruce Gillingham, Kanata, Canada

[73] Assignee: Advanced Memory International, Inc., San Jose, Calif.

[21] Appl. No.: 08/933,673

[22] Filed: Sep. 19, 1997

Related U.S. Application Data

[60] Provisional application No. 60/026,594, Sep. 20, 1996, provisional application No. 60/055,349, Aug. 11, 1997, and provisional application No. 60/057,092, Aug. 27, 1997.

[51] Int. Cl.⁷ .................................................. G06F 12/00
[52] U.S. Cl. .................. 711/167; 711/163; 711/168; 711/169; 365/194; 365/230.03
[58] Field of Search ........................... 711/167, 104, 711/105, 155, 117, 169, 163, 168; 364/489; 365/194, 230.03

[56] References Cited

U.S. PATENT DOCUMENTS

| | | | |
|---|---|---|---|
| 4,866,675 | 9/1989 | Kawashima | 365/194 |
| 5,060,145 | 10/1991 | Scheuneman et al. | 711/169 |
| 5,490,082 | 2/1996 | Rowson | 364/489 |
| 5,784,582 | 7/1998 | Hughes | 711/117 |
| 5,802,586 | 9/1998 | Jones et al. | 711/155 |
| 5,813,023 | 9/1998 | McLaury | 711/105 |
| 5,845,314 | 12/1998 | Ishida | 711/104 |

*Primary Examiner*—Do Hyun Yoo
*Assistant Examiner*—Nasser Moazzami
*Attorney, Agent, or Firm*—Fliesler, Dubb, Meyer & Lovejoy LLP

[57] ABSTRACT

A method and apparatus for optimizing the efficiency of a data bus for a memory device. Extra latency is added between the time a memory controller issues a write instruction and the time the data is transferred on the data bus. This additional latency is optimized to reduce the number of idle time slots on the data bus when switching between a read instruction and a write instruction. Programmable registers are provided for adjusting the amount of latency.

17 Claims, 9 Drawing Sheets

| DELAY | Interger Number of Clock Ticks |
| 7 6 5 4 3 2 1 0 | |
|---|---|
| 0 0 0 0 0 0 0 0 | 0 |
| ⋮ | ⋮ |
| 1 1 1 1 1 1 1 1 | 255 |

READ/WRITE TIMING FOR MAXIMUM UTILIZATION OF BIDIRECTIONAL READ/WRITE BUS

CROSS REFERENCE TO RELATED APPLICATIONS

This application claims priority from the following U.S. Provisional Applications, each of which, including all appendices and attached documents, are incorporated by reference in their entirety for all purposes:

Application Ser. No. 60/026,594, filed Sep. 20, 1996, entitled "Read/Write Timing for Maximum Utilization of Bidirectional Read/Write Bus";

Application Ser. No. 60/055,349, filed Aug. 11, 1997, entitled "SLDRAM Architecture"; and, Application Ser. No. 60/057,092, filed Aug. 27, 1997, entitled "SLDRAM Architecture."

The following copending U.S. patent Applications are hereby incorporated by reference in their entirety for all purposes:

Application Ser. No. 08/818,068, filed Mar. 14, 1997, entitled "Variable CMOS Vernier Delay", based on Provisional Application Ser. No. 60/033,981 filed Dec. 31, 1996;

Application Ser. No. 08/909,299, filed Aug. 11, 1997, entitled "Bifurcated Data and Command/address Communication Bus Architecture for Random Access Memories Employing Synchronous Communication Protocols";

Application Ser. No. 60/055,368, filed Aug. 11, 1997, entitled "A High-Speed Memory Interface (SyncLink)";

Patent application Ser. No. 08/933,713, filed Sep. 19, 1997, entitled "De-Skewing Data Signals In A Memory System" by Bruce Millar; and Patent application Ser. No. 08/933,710, filed Sep. 19, 1997, entitled "High-Speed Bus Structure For Printed Circuit Boards" by Bruce Millar.

BACKGROUND OF THE INVENTION

The present invention relates generally to semiconductor memory devices, and more particularly to dynamic random access memories (DRAM) and a method for controlling DRAMs.

As the technology and speed of processors such as microprocessors and other computer controllers continue to improve, the need for fast and efficient memory devices increases. Often, processors are limited by the speed at which they can retrieve needed data from memory devices. If the data is not available when the processor needs it, the processor stalls until the data is available. This slows the throughput of the system. Consequently, improvements to currently available memory devices are needed to meet the demands of future processors.

Currently available commercial memory devices, such as DRAMs, typically read and write data over a data bus through a bi-directional I/O port. One measure of the efficiency of a memory system is the percentage of time that the data bus is being used. It is desirable that the data bus usage be kept high, so that as much data as possible can be transferred in a given amount of time. If the data bus usage percentage is low, the cycles in which no data is transferred are lost. The lost cycles are cumulative, and for long data transfers result in the loss of a significant amount of bandwidth on the data bus.

Another factor in determining the efficiency of a memory system is the amount of latency in the system. Latency is the time between the receipt of a read or write instruction and the beginning of data transfer on the data bus. Latency can add delay to the time between when data is requested and when it is received. However, if efficiently managed, this small delay at the beginning of a data transfer becomes insignificant overall.

It is desirable to provide a memory device that operates efficiently. Preferably, the memory device will operate to maximize the overall efficiency of the memory system by making optimum usage of the data bus. Consequently, an improved memory device method of operation of a memory device is needed.

SUMMARY OF THE INVENTION

The present invention provides a memory device and a method of controlling the memory device such that it efficiently transfers data over a data bus. A memory controller or other means adjusts the latency of the write cycle based on the latency of the read cycle. By adjusting the write latency, the usage of the data bus may be optimized, thereby reducing the number of idle time slots when switching between read and write instruction. Preferably, the data from the read and write instructions can be transferred during consecutive data transfer time slots on the data bus with no idle time slots between them.

The specific embodiment discloses a memory device for executing this method. The memory device has several banks of memory arrays that allow concurrent pipelined operation for read and write instructions. A programmable register is provided to allow the latency of the read and write instructions to be optimized.

In accordance with one embodiment of the invention, a method is provided for transferring data on a data bus to and from a memory device, including the steps of issuing a read instruction to the memory device, transferring read data from the memory device after a first time period, issuing a write instruction to the memory device, and delaying a transfer of write data to the memory device for a second time period, wherein the length of the second time period is within two time slots of the length of the first time period.

In accordance with another embodiment, a memory system is provided including a memory device, a command bus for transferring read instructions and write instructions to the memory device, and a data bus for transferring read data from the memory device in response to read instructions, the read data being transferred on the data bus a first time period after the read instruction, and for transferring write data to the memory device in response to write instructions, the write data being transferred on the data bus a second time period after the write instruction. The system further includes a memory controller for controlling the flow of data on the data bus, wherein the length of the second time period is subject to control of a first programmable register A further understanding of the nature and advantages of the inventions herein may be realized by reference to the remaining portions of the specification and the attached drawings.

DETAILED DESCRIPTION OF THE SPECIFIC EMBODIMENT

Figures 1, 1A:
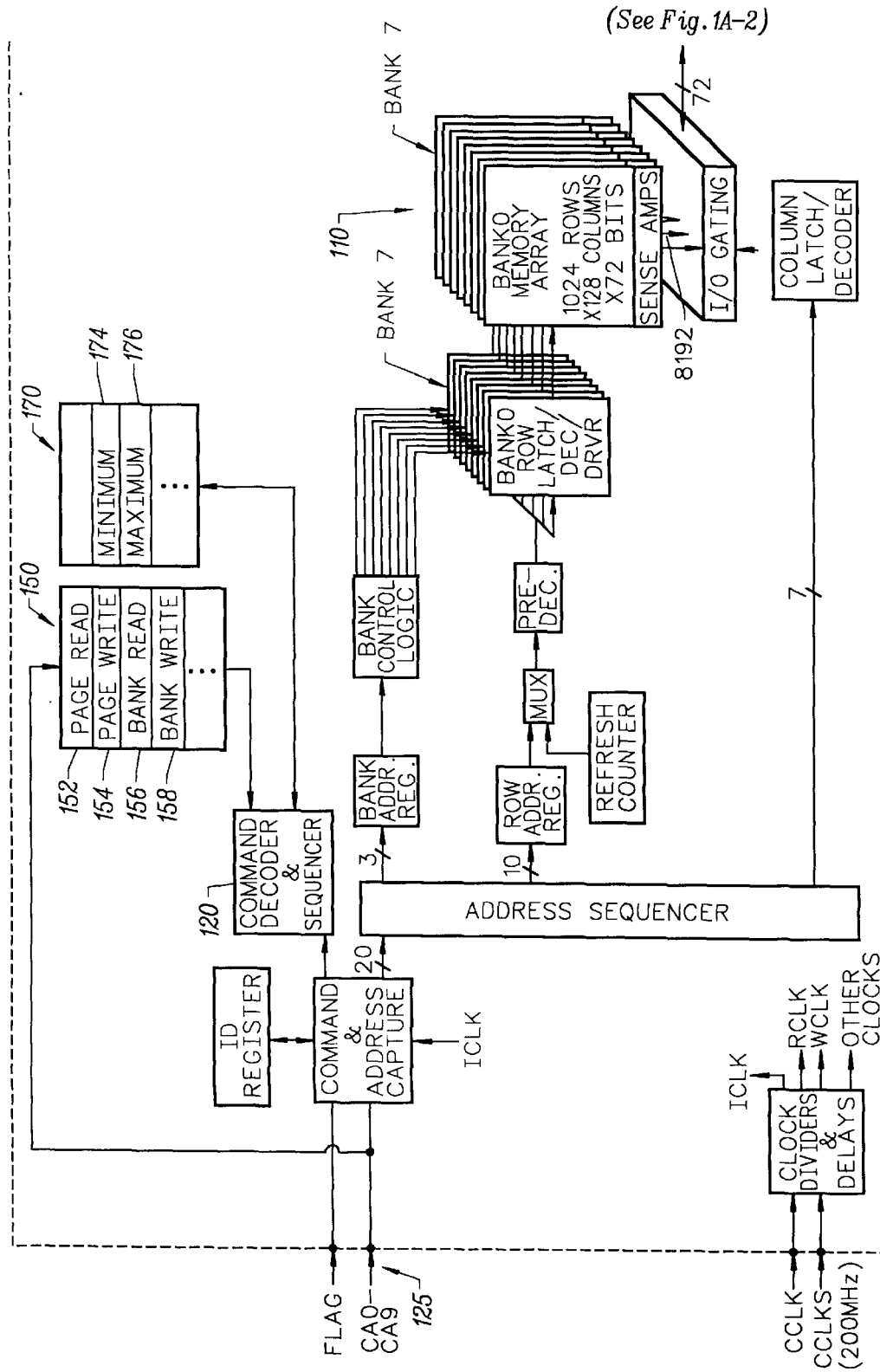
FIG. 1A shows a functional block diagram of a memory device.

FIG. 1A shows a functional block diagram of a memory device 100 that may be used in accordance with the present invention. Memory device 100 may be employed in a variety of environments such as in a main memory (i.e., RAM) of a personal computer, workstation or other digital system. In the specific embodiment, memory device 100 is a synchronous, very high-speed, pipelined, dynamic random access memory (DRAM), although other memory types such as static random access memory (SRAM) may also be used.

Memory device 100 has data storage that is divided into several memory array banks 110. In accordance with a multi-bank memory architecture, each memory array bank 110 may be activated or deactivated independently from the other memory array banks 110. In the specific embodiment, memory device 100 has eight memory array banks 110 (referred to herein as banks "0" to "7" or banks "a" to "h"). Each memory array bank 110 is a 128 K×72 bit memory organized as 1024 rows by 128 columns by 72 bits. However, any number of memory array banks and any size of memory array may be used.

Preferably, the number of independently accessible banks of memory array 110 should be sufficiently large that an idle memory array bank 110 is always available. To achieve this end, the number of memory array banks 110 should preferably exceed the number of time slots during which a given bank of memory array 110 is busy for a read or write cycle. A time slot equals two clock (CLK) cycles, as will be described below. Also, the address space should be appropriately mapped between virtual addresses and real addresses such that consecutive memory accesses are spread out among the different banks efficiently. Following these guidelines, memory device 100 will have a good probability that subsequent memory commands will access an idle memory array bank 110. Some applications may sequence through banks in an orderly fashion so that a free bank can be guaranteed. Another advantage to having multiple memory array banks 110 is that precharging may be completed for idle banks while other banks are active.

External devices (not shown) transfer data to and from memory device 100 over a data bus 115 through an I/O interface 112. Data transfer takes place in predefined data bursts. A time slot is defined as the time it takes to complete a command burst. In the specific embodiment, command transfers take place in bursts of four 10-bit command words (40-bits). One 10-bit command word is transferred on each edge of the clock. Therefore, each time slot comprises two clock cycles, and has four clock edges. The minimum data burst on data bus 115 also occupies one time slot, consisting of four 18-bit words.

Figures 1, 1A, 2:
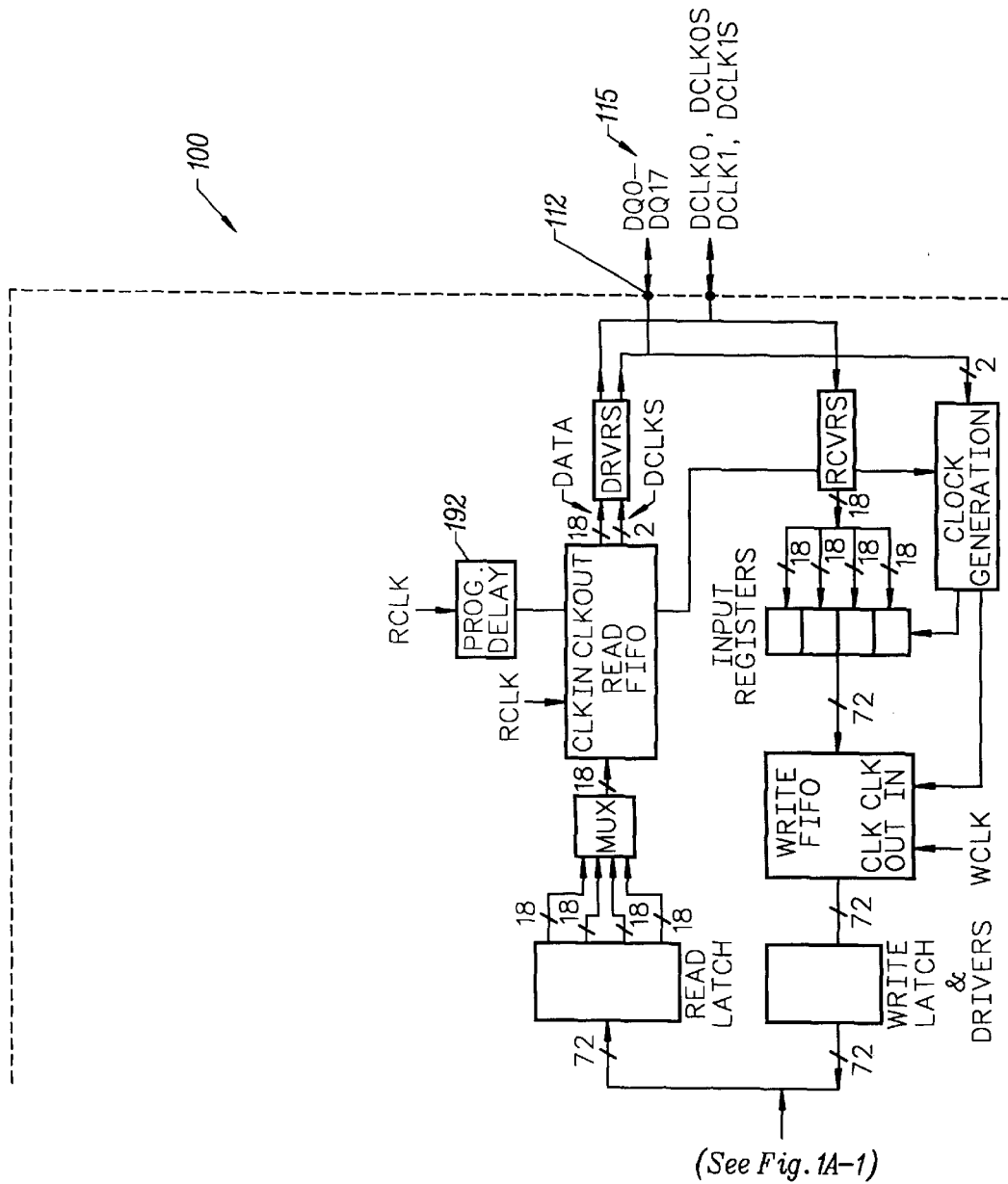
FIG. 2 shows a timing diagram of consecutive read commands.
Figure 1B:
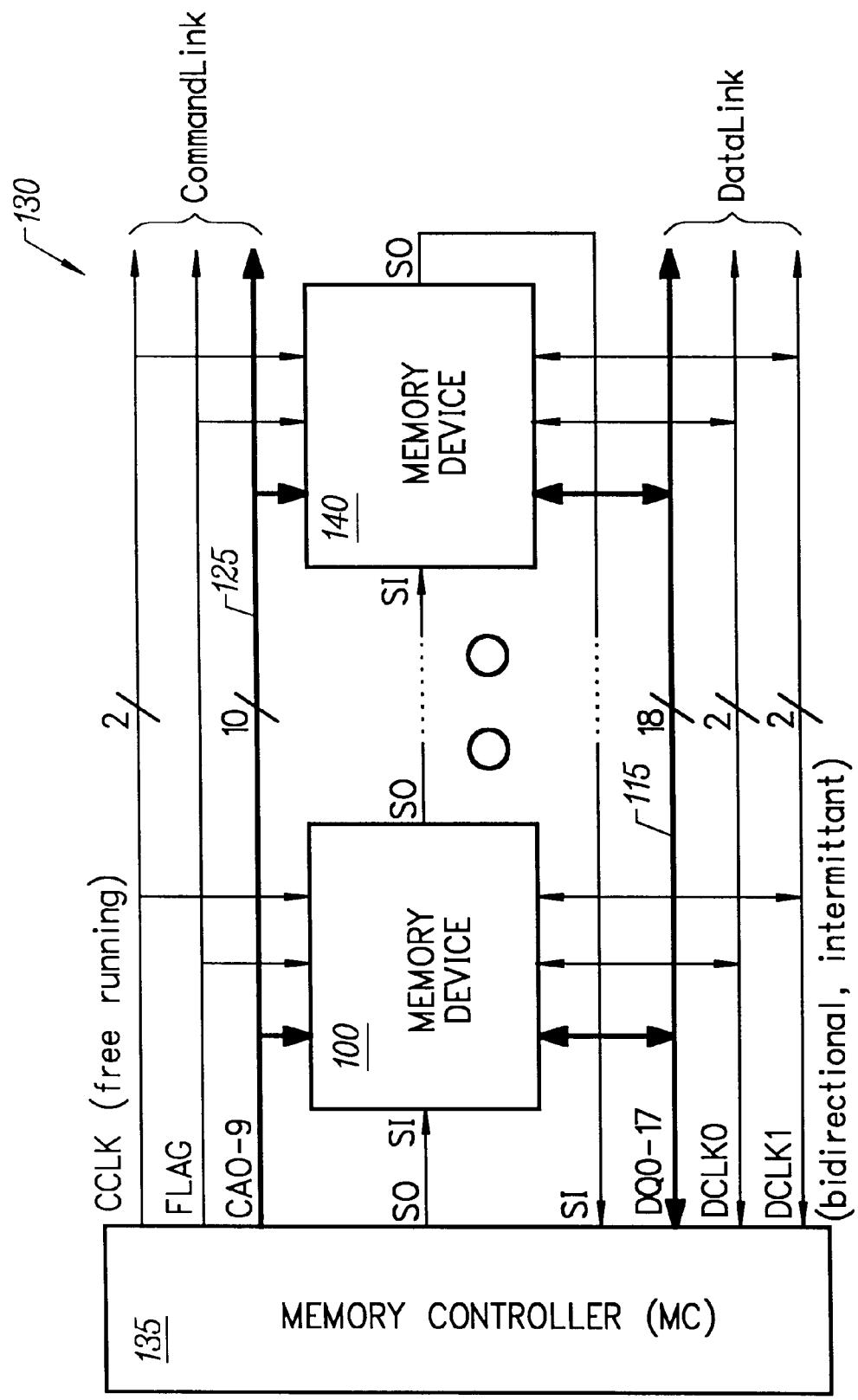
FIG. 1B shows a memory system employing the memory device of FIG. 1A.

Referring to FIG. 1B, a memory controller 135 controls device 100, as well as possibly other like devices (e.g., memory device 140.) Memory devices 100 and 140 may be coupled in parallel in a memory system 130. Although only two memory devices 100 and 140 are shown, memory system 130 may have many memory devices. Further, memory devices 100 and 140 need not be identical types of memory devices.

Memory controller 135 sends command and control information (such as read and write memory instructions) to memory devices 100, 140 on a uni-directional command/address bus 125. Read and write data, however, is exchanged between controller 135 and devices 100, 140 on a bi-directional data bus 115. Both command/address bus 125 and data bus 115 preferably operate at the same frequency (i.e., 400 MHz, 600 MHz, 800 MHz, etc.). Memory controller 135 is, in turn, controlled by a microprocessor (not shown) or other like device according to conventional computer system architecture and operation.

In the specific embodiment, memory device 100 is heavily pipelined. Referring again to FIG. 1A, a command decoder 120 receives instructions from command/address bus 125 and controls a pipeline that executes the commands. Additional details of memory device 100 and system 130 may be found in Provisional Application Ser. No. 60/057,092, referenced above.

Memory device 100 operates in two modes, bank mode and page mode. In bank mode operations, a DRAM row of one of memory array banks 110 is opened (i.e., activated) prior to the data access, and closed (i.e., deactivated) following the data access. In page mode operations, the DRAM row is already open and the data access can occur immediately. As is well-known, page mode operation allows faster memory access by keeping the same row address while selecting multiple column addresses.

Referring again to FIG. 1A, memory device 100 includes two sets of registers, control registers 150 and status registers 170. In the specific embodiment, each individual control register 150 is eight bits wide, although some applications may usefully provide other sizes of control registers. For example, the specific embodiment architecturally reserves 20 bits for future expansion, although only eight bits are physically implemented. Further, each individual status register 170 is 32 bits wide in the specific embodiment, although some applications may usefully provide other sizes of status registers. For example, the specific embodiment architecturally reserves 72 bits for future expansion, although only 32 bits are physically implemented.

Control registers 150 include four delay registers 152–158 for controlling read and write latency. Other registers may also be included in control registers 150. Read and write latency is the amount of time between the receipt of a read or write instruction, and the corresponding flow of data on data bus 115. One delay register 152 specifies how much latency is desired by the user for a page read command, a second delay register 154 specifies how much latency is desired by the user for a page write command. The other two delay registers 156 and 158 specify the amount of latency for a bank read and bank write command, respectively. Delay registers 152–158 may be programmed via controller 135 by a user of system 130, or by software that, for example, monitors the efficiency of data bus 115. In the specific embodiment, each of the four delay registers 152–158 are eight bits wide supporting a range of 0 to 255 counts or "ticks". Each tick represents a clock half cycle.

Figure 1C:
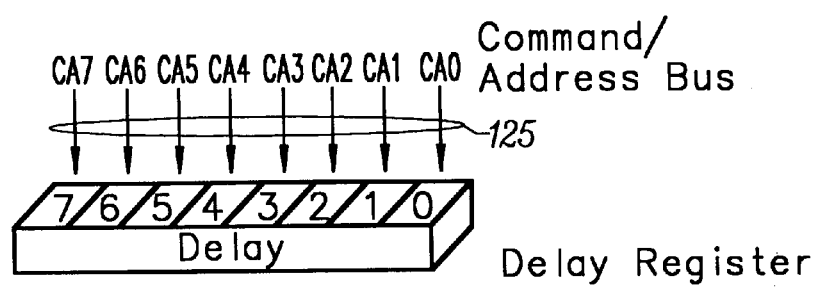
FIG. 1C shows a delay register for specifying a read or write delay value.
Figure 2:
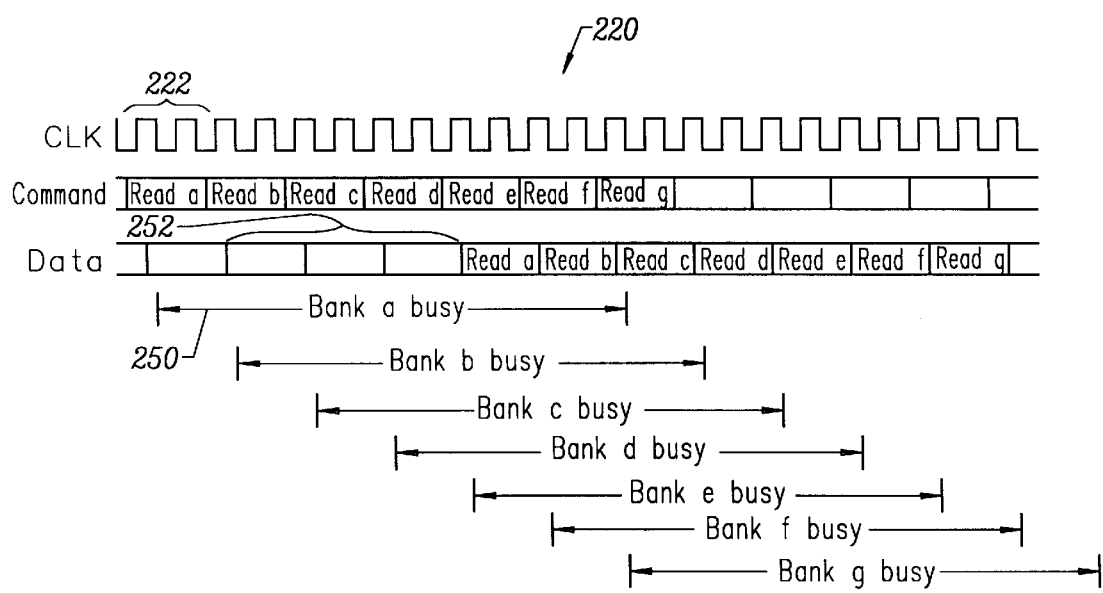

FIG. 1C shows a typical architecture for delay registers 152–158. Each delay register 152–158 is eight bits wide. Memory controller 135 writes a delay value to delay registers over control/address lines 125, depending upon the latency desired. As shown in a chart 190 in FIG. 1C, the integer value of the delay value specified in delay registers 152–158 corresponds to the number of clock ticks of delay. Each clock tick is one half of a clock cycle, and represents a single clock edge. In the specific embodiment, one time slot (previously defined to be the time for a command burst cycle) is equal to four clock ticks. Therefore, a delay value with an integer value of four (i.e., binary 0000 0100) in the delay register would correspond to one time slot.

The specific embodiment includes four delay registers; namely, Page Read Delay Register 152, Page Write Delay Register 154, Bank Read Delay Register 156, and Bank Write Delay Register 158. These four delay registers maintain the desired delay for read and write commands in page mode and bank mode, respectively.

Page Read Delay Register 152 is used to program the number of integer clock ticks between when memory device 100 receives a Page Read Request Packet (i.e., a page read instruction) on command/address bus 125 and provides the corresponding Read Data on data bus 115. Similarly, Page Write Delay Register 154 is used to program the number of integer clock ticks between when memory device 100 receives a Page Write Request Packet (i.e., a page write instruction) on command/address bus 125 and receives the corresponding Write Data on data bus 115. Further, Bank Read Delay register 156 is used to program the number of integer clock ticks between when memory device 100 receives a Bank Read Request Packet (i.e., a bank read instruction) and provides the corresponding Read Data; and, Bank Write Delay Register 156 to program the number of integer clock ticks between when memory device 100 receives a Bank Write Request Packet (i.e., a bank write instruction) and receives the corresponding Write Data.

Although the eight bit delay registers 152–158 can support a range from 0 to 255 clock ticks, the value programmed must be between certain minimum and maximum values, as provided in status registers 172 and 174, respectively. For example, memory device 100 has an inherent latency associated with it and, in a preferred embodiment, registers 150 hold absolute values (i.e., values which include the inherent latency as well as any supplemental delay). Accordingly, any supplemental delay provided by a value in registers 150 is measured by the amount of the absolute value exceeding the inherent delay. As such, the delay value held in page read delay register 152 should not be less than the inherent latency.

While delay registers 152–158 specify the amount of delay in gross increments, a variable vernier delay device (not shown) is provided in the command decoder 120 for fine tuning the delay (e.g., in steps of 300 ps or less). Memory devices 100, 140 will inevitably have small variations in timing based upon the electrical characteristics of the devices. These variations are evened out by the variable vernier delay device.

Briefly, variable vernier delay is set by incrementing/decrementing an internal counter (controlled by memory controller 135 and disposed in a programmable delay block 192) to a desired value and using this as a digital input signal to the variable vernier delay device. Details of a preferable variable vernier delay device may be found in copending U.S. patent application Ser. No. 08/818,068, referenced above.

In operation, memory device 100 relies upon the delay value(s) held in registers 150, each of which may subsequently be modified by the variable vernier delay, to determine and control delay for memory access. In one embodiment, vernier values are accessed separately from delay values held in registers 150. Alternatively, these values may be combined and stored in a single bank of registers.

Referring again to FIG. 1A, status registers 170 include two 32-bit registers, namely, Minimum Delay Register 174 and Maximum Delay Register 176. Other registers may also be included in status registers 170. Minimum Delay Register 174 contains the Minimum Page Read Delay (bits 0–7), the Minimum Page Write Delay (bits 8–15), the Minimum Bank Read Delay (bits 16–23), and the Minimum Bank Write Delay (bits 24–31). These values may be derived from device characteristics and operating frequency and correspond to the minimum delay value that may be written into each of the respective delay registers 152–158.

Maximum Delay Register 174 contains the Maximum Page Read Delay (bits 0–7), the Maximum Page Write Delay (bits 8–15), the Minimum Bank Read Delay (bits 16–23), and the Maximum Bank Write Delay (bits 24–31). These values may also be derived from device characteristics and operating frequency and correspond to the maximum delay value that may be written into each of the respective delay registers 152–158.

Each memory instruction has an inherent latency associated with it. Latency is the amount of time between the receipt of the instruction, and the corresponding flow of data on data bus 115. In the specific embodiment, operating at 400 MHz (where one time slot=10 ns,) the inherent read latency for a bank read command is roughly five time slots. The inherent write latency for a bank write command is roughly one time slot. In other words, with no delay added by the system, data begins to flow on data bus 115 five time slots after the memory controller issues a bank read instruction, and data may be provided on data bus 115 after a gap of one time slot following the issuance of a write command by memory controller 135. Further, the inherent latency for a page read or write command is roughly three time slots or zero time slots, respectively. Accordingly, data may be provided on data bus 115 immediately following the issuance of a page write command, and data will be available three time slots following a page read command.

Referring now to FIGS. 2–5A and 5B, several timing diagrams for memory system 130 are shown. In the timing diagrams, timing diagram lines labeled "command" represent signals on command/address bus 125 and lines labeled "Data" represent signals on data bus 115. Further, the timing diagrams show operation of the specific embodiment with a clock frequency of 250 MHz.

FIG. 2 shows a timing diagram 220 wherein data is read consecutively from several memory array banks 110 of memory device 100 over data bus 115. Memory controller 135 issues a "read a" instruction to a memory array bank 110 designated as memory array bank "a" during a first time slot 222. Roughly three time slots later, memory device 100 places data from memory array bank "a" on data bus 115. Memory array bank 110 from which data is being read is busy for a total of six time slots from the time the command is issued. This is indicated in FIG. 2 with a time span 250 labeled as "bank a busy". With inherent latency of three time slots, each bank is busy for six time slots when data is read.

By rotating memory requests between the eight different memory array banks 110, data bus 115 can be kept full. This is shown in timing diagram 220. After suffering an idle gap 252 for the initial latency time, data bus 115 has no idle time slots. Since there are no idle time slots, the efficiency of memory system 130 is high, especially if the amount of data being transferred is high compared to the latency. The only lost time slots are at the beginning of the read burst where the initial latency period is incurred.

Figure 3:
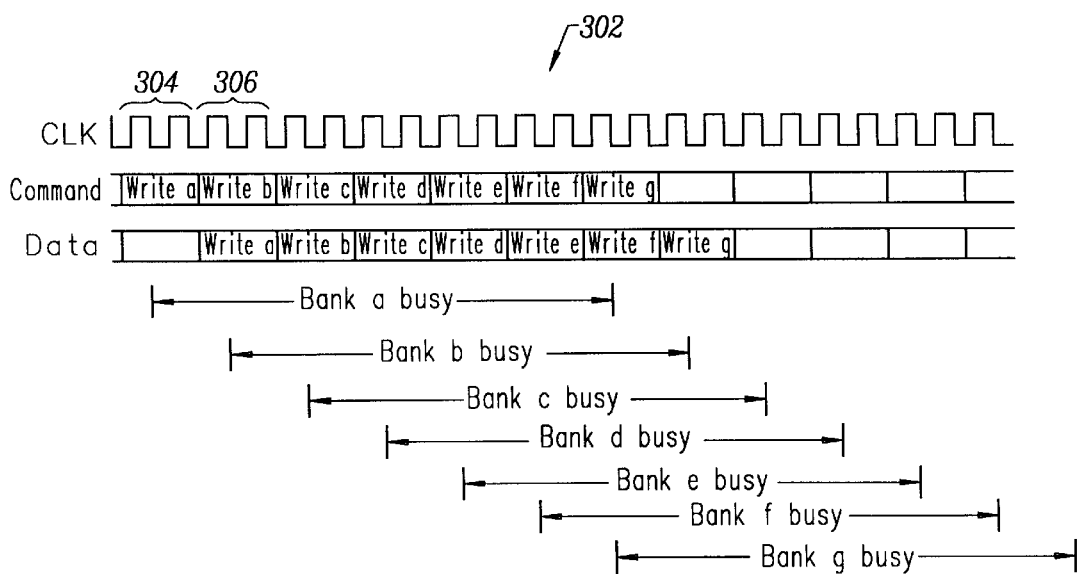
FIG. 3 shows a timing diagram of consecutive write commands.

Similarly, FIG. 3 shows a timing diagram 302 for a bank write cycle or a bank write burst. Memory controller 135 issues a "write a" instruction to memory array bank "a" during a first time slot 304. During the next time slot 306, memory device 100 places the data on data bus 115. By writing consecutively to different memory array banks 110, data bus 115 is kept full even though each bank 110 is busy for six consecutive cycles.

In prior art systems, write data was supplied on data bus 115 early in the write cycle. This allowed memory array banks 110 to finish writing its data as soon as possible. Therefore, its busy time was short. Because it was busy for as short a time as possible, the system was less likely to have memory stalls due to having to wait for data on a busy memory array bank 110. However, in using this prior art method, an inefficiency occurred mixing read and write commands. Write data was provided on data bus 115 early in the cycle to minimize the time that memory array bank 110 was busy. Yet, read data was not available on data bus 115 until relatively late in the cycle. This caused gaps in the bus utilization as shown in FIG. 4.

Figure 4:
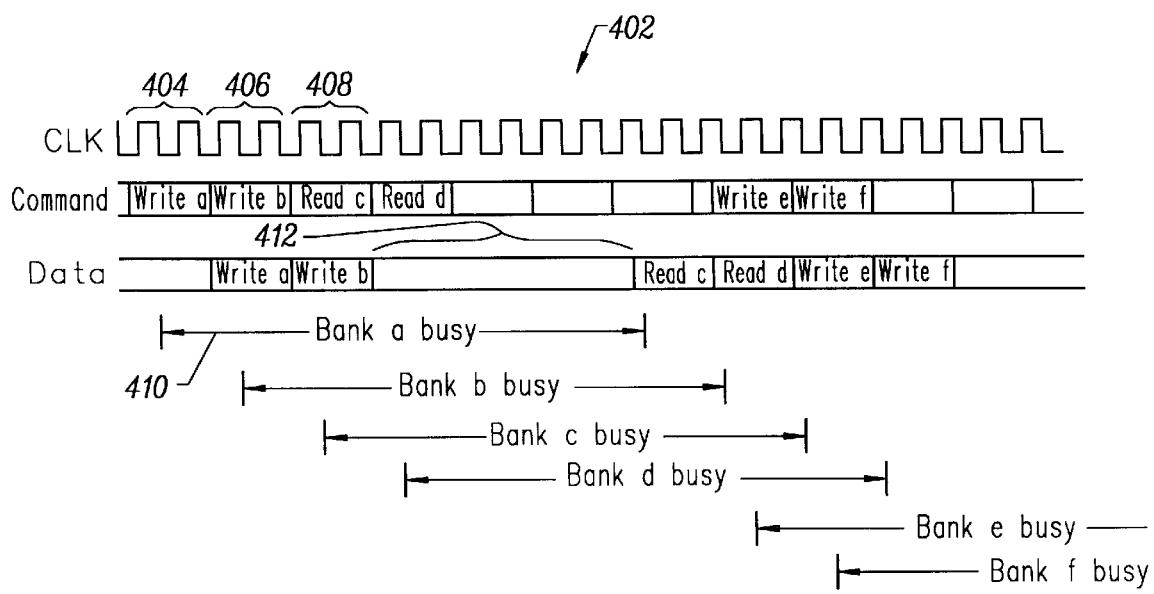
FIG. 4 shows a timing diagram of mixed read and write commands according to a prior art technique.

FIG. 4 shows a timing diagram 402 of mixed read and write commands to memory device 100 according to a prior art method. A "write a" command is issued for memory array bank "a" during a first time slot 404. During the next time slot 406, the associated data is placed on data bus 115. Memory bank "a" is then busy for about the following six cycles (see time span 410) until the data is safely stored in memory device 100. Also during time slot 406, memory controller 135 issues a "write b" command to memory array bank "b" and data is placed on data bus 115 during time slot 408.

During time slot 408, memory controller 135 issues a "read c" command to memory array bank "c". Because of the read latency, data bus 115 is idle for about three time slots 412 while memory device 100 retrieves the "read c" data from memory array bank "c" and places the data on data bus 115. These idle time slots represent unused bandwidth on data bus 115. This is an inefficiency that is preferably avoided.

Figure 5A:
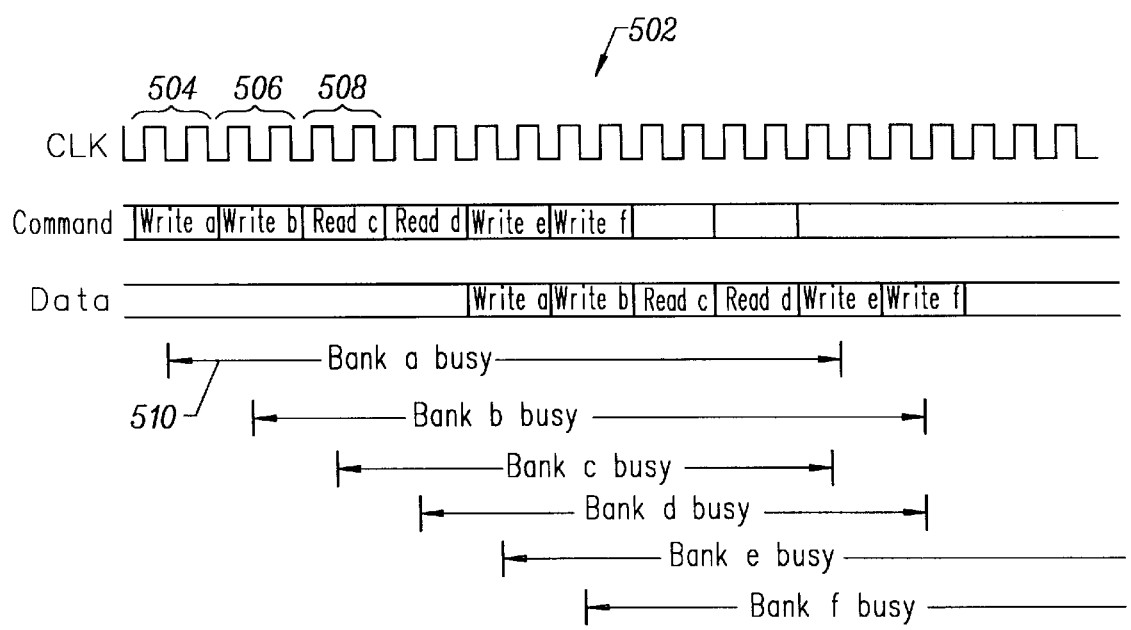
FIGS. 5A and 5B show timing diagrams of mixed read and write commands to a memory device according to the present invention.

FIG. 5A shows a timing diagram 502 with mixed read and write commands according to an improved method of the present invention. In a first time slot 504, memory controller 135 issues a "write a" command to memory array bank "a". However, the corresponding data is not placed on data bus 115 until three time slots later. This is repeated with a second "write b" command during time slot 506. Next, the memory controller issues a "read c" command during time slot 508. Approximately, three time slots later, the read data (i.e., "read c") appears on data bus 115 from memory array bank "c". As can be seen by FIG. 5, no empty time slots appear on data bus 115 between the data for the previous write commands and the data for the read command, thus illustrating a significant improvement in data bus utilization.

The read command with latency of three time slots is shown by way of example, only. Some commands may have more or less latency depending on the type of command (i.e., page or bank read commands,) the clock frequency, timing delays, or other factors. For example, a particular read command may have a latency of five time slots (as described above with respect to the page write command.) In such cases, the corresponding delay before providing the data for a subsequent write command may be adjusted according to the read delay. In one embodiment, the write delay may be made roughly equal to the read delay. In other embodiments, a difference in delay values may be provided. For example, if the read delay is five time slots, data may be delayed for five time slots after the write command, as opposed to the three time slots shown in FIG. 5A.

Figure 5B:
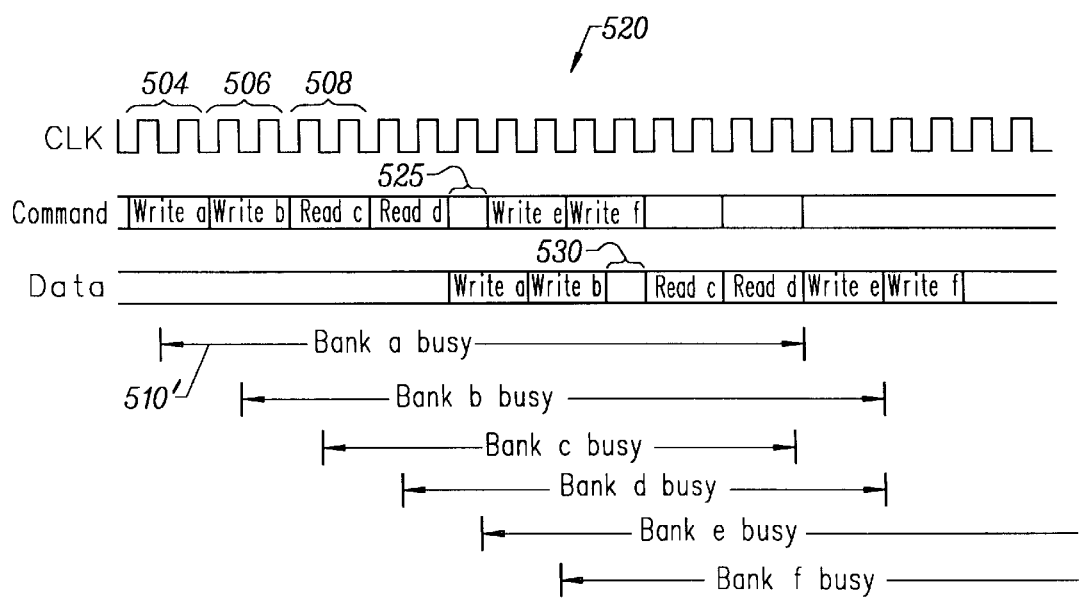

The operation depicted in FIG. 5A is that of a single device 100 servicing all memory instructions. In contrast, FIG. 5B shows a timing diagram 520 for a system 130 containing two devices 100 and 140, as shown in FIG. 1B. Diagram 520 is nearly identical to diagram 502 except for time gaps 525 and 530. These gaps appear whenever there is a switch from one memory device (e.g., device 100) driving data bus 115 to another device (e.g., device 140) driving the bus. Preferably, these gaps are 2N in duration where N is a half clock cycle. Such gaps are necessary to allow for signal settle time (i.e., signal decay), compensate for signal drift, timing inaccuracies, etc. Even with such time gaps, however, the operation depicted in FIG. 5B is a significant improvement in data bus utilization compared with, for example, timing diagram 402 of FIG. 4.

Delaying the latency on write data reduces or eliminates the wasted time slots on data bus 115. However, by doing so, the time that memory array bank 110 is busy increases from approximately six time slots to approximately nine time slots, as illustrated by time spans 510 and 510' of FIGS. 5A and 5B, respectively. Consequently, a memory array bank 110 collision rate increases since the banks are open (i.e., active) for an extended period. In other words, the amount of time the bank is not usable is increased. This is generally not a significant factor for most applications. Generally, the read/write ratio is such that the advantages of limiting the loss to approximately three entire time slots every time a write is performed, greatly outweigh the effects of increased collision rates. For example, a typical read/write ratio of 3:1 would suffer minimal effects from the increased collision rate.

In another embodiment of the present invention, this penalty for extending the time that memory array bank 110 is busy can be eradicated with the addition of hardware. At the beginning of a write cycle, memory device 100 can latch data from data bus 115 into a register (not shown). The pipeline can move the data synchronously through the pipeline along with the write command instruction such that it actually arrives at the memory banks at the time it would have arrived had it been presented later in time without pipelining it, as described above. Consequently, memory array bank 110 is not kept busy for the time before the instruction is ready to be acted upon. Nevertheless, the command instruction time is still nine time slots, since the time from the issuance of the write command to the end of the data transfer is nine time slots.

Although a specific embodiment of the present invention has been presented, no additional limitations to the invention have been implied or intended. Changes to the specific embodiment which do not deviate from the spirit and scope of the claims are intended to be covered by this invention. For example, though a specific memory device 100 is described, other memory devices may be substituted. For example, an existing SDRAM with a modified controller to increase to latency of the write command may be used. The present invention is intended to be limited only by reference to the attached claims.

What is claimed is:

1. A method of transferring data on a data bus to and from a memory device, comprising the steps of:

issuing a read instruction to the memory device;

transferring read data from the memory device after a first time period;

issuing a write instruction to the memory device; and delaying a transfer of write data to the memory device for a second time period, wherein the length of the second time period is within two time slots of the length of the first time period.

2. The method of claim 1, wherein a relationship of length of the second time period to length of the first time period is selected to allow the read data and the write data to be transferred on the data bus in consecutive time slots.

3. The method of claim 1 wherein the read instruction is issued after the write instruction.

4. The method of claim 3, wherein the read instruction is issued during a time slot immediately following the issuance of the write instruction.

5. The method of claim 1, wherein the difference between the first time period and the second time period is less than one clock cycle.

6. The method of claim 1, wherein the first time period is three time slots and the second time period is three time slots.

7. The method of claim 1, further comprising programming the length of the second time period in a first programmable register.

8. The method of claim 7, further comprising programming the length of the first time period in a second programmable register.

9. A memory system, comprising:

a memory device;

a command bus for transferring read instructions and write instructions to the memory device;

a data bus for transferring read data from the memory device in response to read instructions, the read data being transferred on the data bus a first time period after the read instruction, and for transferring write data to the memory device in response to write instructions, the write data being transferred on the data bus a second time period after the write instruction; and a memory controller for controlling the flow of data on the data bus, wherein the length of the second time period is subject to control of a first programmable register.

10. The memory system of claim 9, wherein the read instruction is issued after the write instruction.

11. The memory system of claim 9, wherein a relationship of the length of the second time period to the length of the first time period allows the read data and the write data to be transferred in consecutive time slots on a data bus.

12. The memory system of claim 9, wherein the difference between the first time period and the second time period is less than one clock cycle.

13. The memory system of claim 9, wherein the first time period is three time slots and the second time period is three time slots.

14. The memory system of claim 9, wherein the length of the second time period is within two time slots of the length of the first time period.

15. The memory system of claim 9, further comprising a second programmable register, wherein the first time period is programmed in the second programmable register.

16. A memory device, comprising:

a data bus;

first and second memory array banks coupled to said data bus;

first and second delay registers, the first delay register specifying a first time period and the second delay register specifying a second time period; and a command decoder for receiving a write instruction for the first memory array bank and a read instruction for the second memory array bank, wherein data is transferred on the data bus to the first memory array bank following a delay of the first time period after the command decoder receives the write instruction, and data is transferred to the second memory array bank following a delay of the second time period after the command decoder receives the write instruction.

17. The memory device of claim 16, wherein the difference between the first time period and the second time period is less than one clock cycle.

* * * * *